US006950325B1

(12) United States Patent
Chen

(10) Patent No.: US 6,950,325 B1
(45) Date of Patent: Sep. 27, 2005

(54) CASCADE-CONNECTED ROM

(75) Inventor: Hwung-chung Chen, Hsinchu (TW)

(73) Assignee: Winbond Electronics Corporation, Hsinchu (TW)

( * ) Notice: Subject to any disclaimer, the term of this patent is extended or adjusted under 35 U.S.C. 154(b) by 0 days.

(21) Appl. No.: 10/959,159

(22) Filed: Oct. 7, 2004

(51) Int. Cl.[7] ............................................. G11C 17/00
(52) U.S. Cl. ............... 365/94; 365/185.17; 365/185.12
(58) Field of Search ........................... 365/94, 185.17, 365/185.12

(56) References Cited

U.S. PATENT DOCUMENTS

| | | | | |
|---|---|---|---|---|
| 4,570,239 A | * | 2/1986 | Carter et al. | ................. 365/203 |
| 5,740,108 A | * | 4/1998 | Okubo | .................. 365/185.17 |

* cited by examiner

Primary Examiner—Anh Phung
Assistant Examiner—N. Nguyen
(74) Attorney, Agent, or Firm—Finnegan, Henderson, Farabow, Garrett & Dunner, L.L.P.

(57) ABSTRACT

A serial read-only memory (SROM) device having an address range includes a memory array, an address clock pin for receiving an address clock signal, which starts an address cycle, a data clock pin for receiving a data clock signal, which starts a data cycle, a chip select/cascade (CS/CAS) pin for receiving a first control signal during the address cycle and for receiving a second control signal during the data cycle, a first data pin for receiving an address during the address cycle and for sending data during the data cycle, and a second data pin for receiving external data, the second data pin being connectable to the first data pin through a cascading data path defined therebetween, wherein the external data received at the second data pin may be transmitted to the first data pin when the cascading data path is connected.

24 Claims, 3 Drawing Sheets

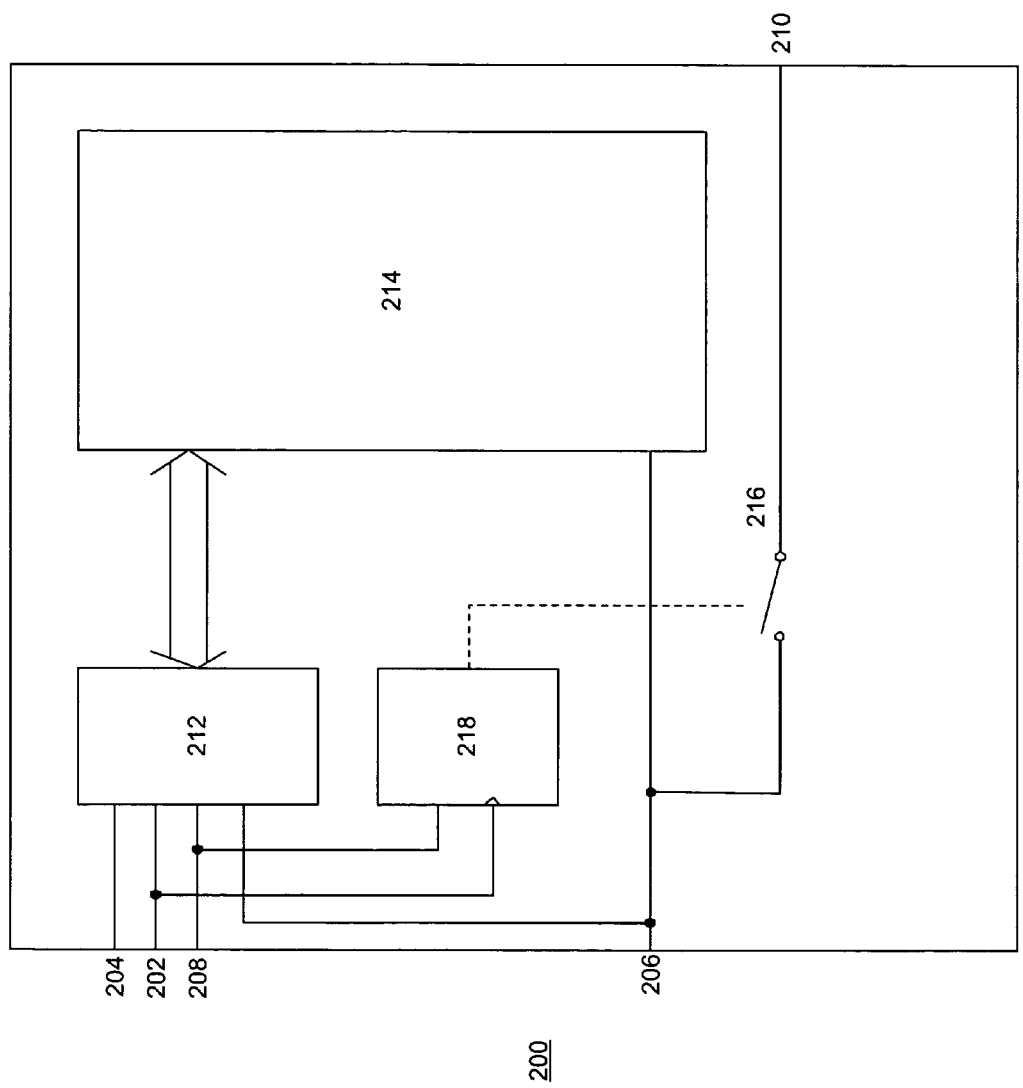

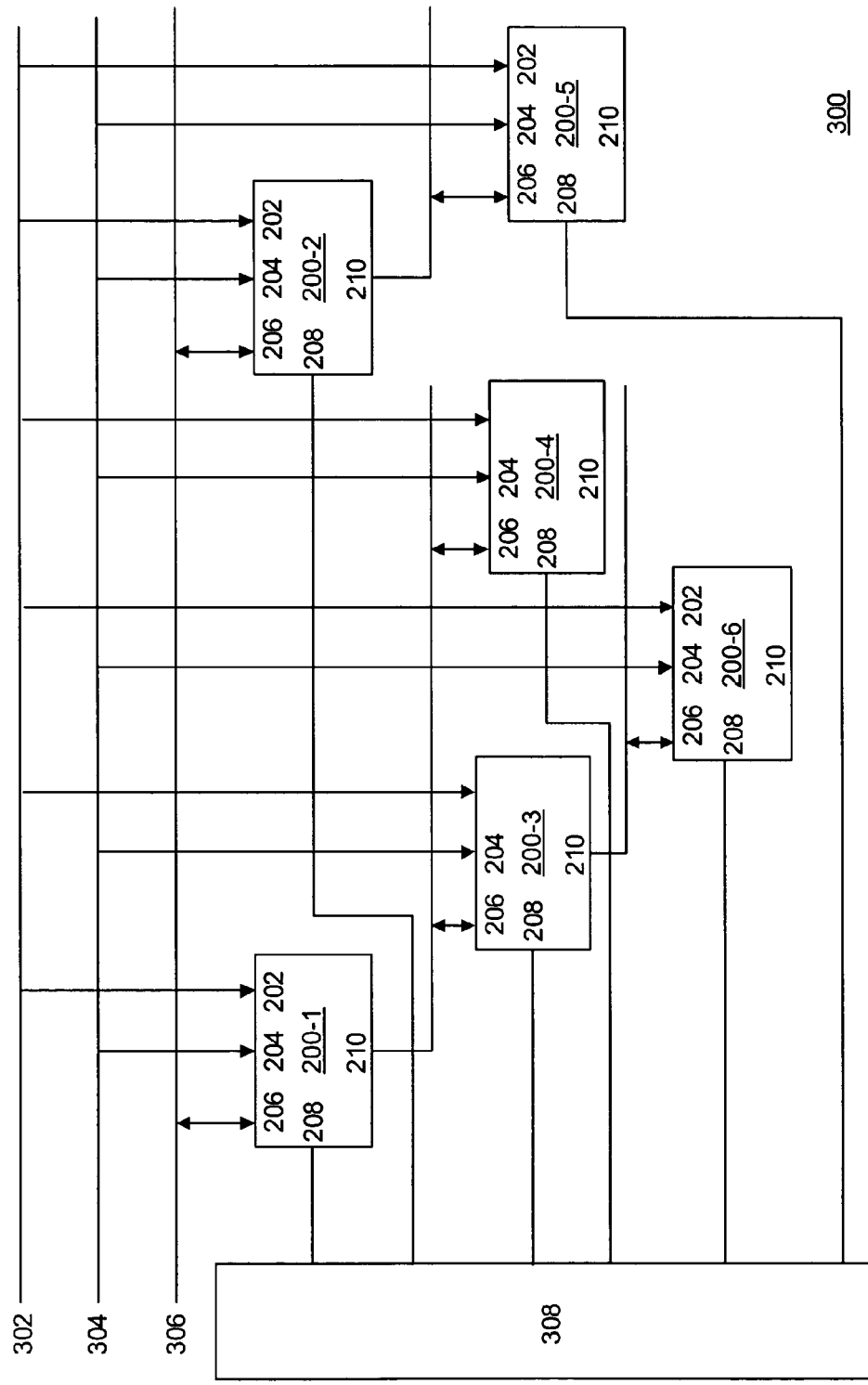

CASCADE-CONNECTED ROM

DESCRIPTION OF THE INVENTION

FIELD OF THE INVENTION

This invention relates to a serial read-only memory (ROM) device and, more particularly, to a novel cascaded serial ROM.

BACKGROUND OF THE INVENTION

In a computer system, hardware identifier or system configuration information is often stored in a read-only memory (ROM) device and sometimes in a serial ROM (SROM). An SROM generally includes an array of memory cells that may be accessed sequentially. Each memory cell corresponds to an address and the SROM corresponds to a range of addresses. When an address provided to the SROM falls within the address range of that SROM, the SROM is activated, the address is stored, and data may be read out of the SROM starting from the memory cell whose address matches the stored address. After data are read out of that memory cell, the stored address automatically increases and the next memory cell in the array is read. Thus, at boot-up, a controller in the computer system provides an initial address and data may be read sequentially from an SROM if the initial address falls in the address range of that SROM.

Serial ROM W551C manufactured by Winbond Electronics Corp. is generally used in a memory system to provide a memory capacity of up to 16 megabits (Mb). FIG. 1 briefly illustrates a portion of a memory system 100 including a plurality of W551C memories including SROMs 102a and 102b connected to a plurality of bus lines. The bus lines may include a data clock line for receiving a data clock signal, an address clock line for receiving an address clock signal, and a data line for receiving an address or transmitting data. The bus lines are further connected to other parts of system 100, collectively shown as a peripheral circuit 104, for providing control signals or exchanging data. Peripheral circuit 104 may include microprocessors, parallel ROMs, etc. Each serial ROM W551C 102a and 102b corresponds to a different address range. For example, serial ROM W551C 102a may have an address range of 101–200 and serial ROM W551C 102b may have an address range of 201–300.

At boot-up of system 100, peripheral circuit 104 sends an address clock signal through the address clock line, which resets SROMs 102a and 102b and starts an address cycle. Then an initial address is sent through the data line to all of the SROMs during the address cycle. If the initial address falls within the address range of one of the SROMs, that SROM is activated and the initial address is stored therein. Then, during a data cycle, data are read out of the activated SROM starting from a memory cell at the initial address. In the case of the W551C SROM, data may be read out of the SROMs on one or both edges of each cycle of the data clock signal. After data are read out of each memory cell, the address stored in the activated SROM automatically increases by 1, and the next memory cell is accessed.

Because only one SROM may be accessed at a time, each SROM in memory system 100 must have a different address range from another SROM. In addition, since the address input during the address cycle generally has only 24 bits, the maximum memory size of memory system 100 working on such a 24-bit address scheme is only 16 Mb. To expand the memory size of memory system 100 requires an increase in the number of address bits provided to the SROMs during the address cycle, which in turn would require significant modifications in other parts, hardware and/or software, of the system.

SUMMARY OF THE INVENTION

In accordance with the present invention, there is provided a serial read-only memory (SROM) device having an address range includes a memory array, an address clock pin for receiving an address clock signal, which starts an address cycle, a data clock pin for receiving a data clock signal, which starts a data cycle, a chip select/cascade (CS/CAS) pin for receiving a first control signal during the address cycle and for receiving a second control signal during the data cycle, a first data pin for receiving an address during the address cycle and for outputting data during the data cycle, and a second data pin for receiving external data, the second data pin being connectable to the first data pin through a cascading data path defined therebetween, wherein the external data received at the second data pin may be transmitted to the first data pin when the cascading data path is connected.

In accordance with the present invention, there is also provided a memory system that includes an address clock bus line for transmitting an address clock signal, which starts an address cycle, a data clock bus line for transmitting a data clock signal, which starts a data cycle, a data bus line for transmitting an address during the address cycle and data during the data cycle, a chip controller, and a plurality of serial read-only memory (SROM) chips. Each SROM chip corresponds to a respective address range and includes a memory array, an address clock pin coupled to the address clock bus line for receiving the address clock signal, a data clock pin coupled to the data clock bus line for receiving the data clock signal, a chip select/cascade (CS/CAS) pin coupled to the chip controller to receive a cascading signal during the address cycle and to receive a chip select signal during the data cycle, a first data pin for receiving the address during the address cycle and for outputting data during the data cycle, and a second data pin for receiving external data, the second data pin being connectable to the first data pin through a cascading data path defined therebetween, wherein the external data received at the second data pin may be transmitted to the first data pin when the cascading data path is connected.

Additional features and advantages of the invention will be set forth in part in the description which follows, and in part will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of this specification, illustrate embodiments of the invention and, together with the description, serve to explain the features, advantages, and principles of the invention.

In the drawings,

FIG. 2 shows a structure of an SROM consistent with an embodiment of the present invention; and FIG. 3 shows a memory system utilizing a plurality of the SROMs shown in FIG. 2.

DESCRIPTION OF THE EMBODIMENTS

Figure 1:
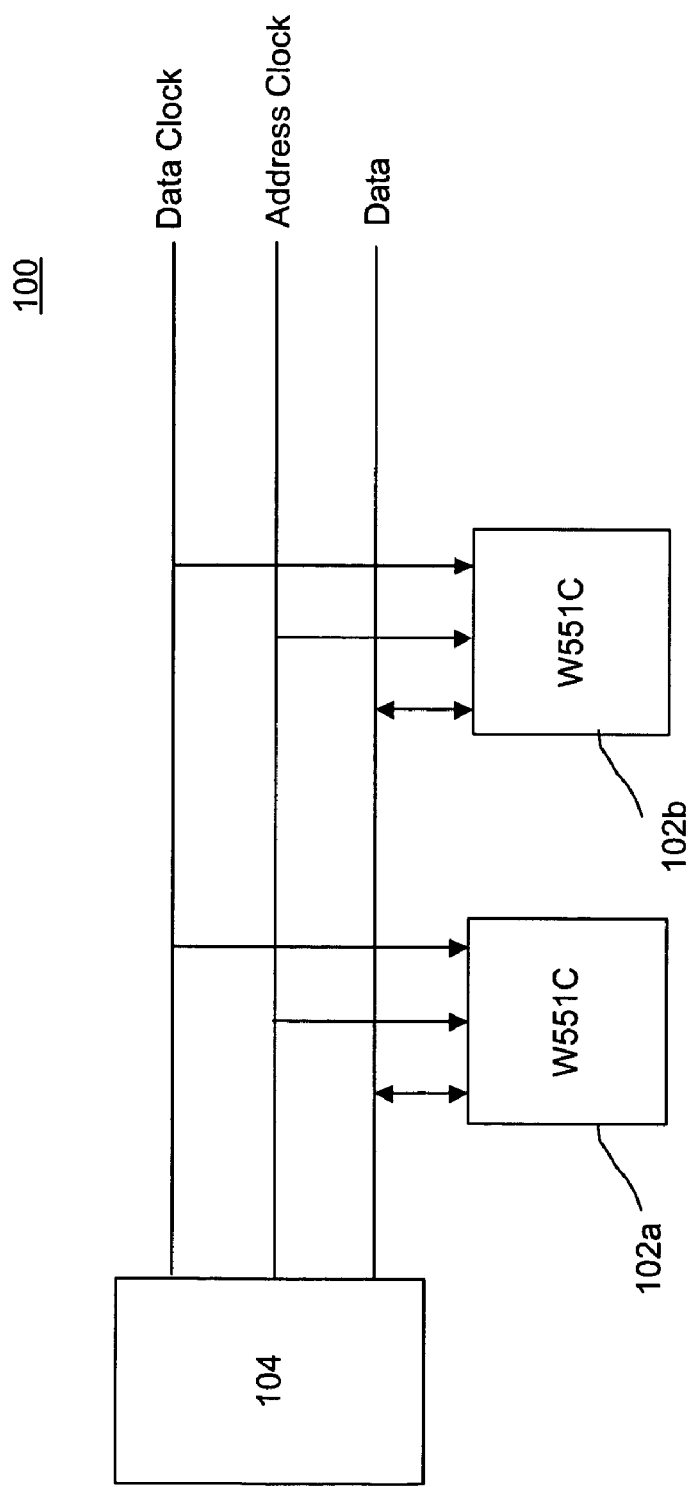
FIG. 1 shows a conventional memory system utilizing a plurality of conventional serial read-only memory (SROM) chips.

Reference will now be made in detail to the present embodiments of the invention, examples of which are illustrated in the accompanying drawings. Wherever possible, the same reference numbers will be used throughout the drawings to refer to the same or like parts.

The present invention provides for an SROM memory system including a plurality of serial read-only memory (SROM) chips. A memory capacity of the SROM memory system consistent with the present invention may be easily expanded without increasing the number of address bits required to address the SROM chips. In other words, a bus structure of the memory system does not have to be modified for the expansion of memory storage. An embodiment consistent with the present invention is described with references to FIGS. 2 and 3.

FIG. 2 shows a novel SROM 200 consistent with an embodiment of the present invention. As shown in FIG. 2, SROM 200 has at least five pins including an address clock pin 202, a data clock pin 204, a first data pin 206, a chip select/cascade (CS/CAS) pin 208, and a second data pin 210. Inside SROM 200, a chip controller 212 is coupled to address clock pin 202 to receive an address clock signal, which starts an address cycle; coupled to data clock pin 204 to receive a data clock signal, which starts a data cycle; coupled to first data pin 206 to receive an address during the address cycle; and coupled to CS/CAS pin 208 to receive a chip select signal. Chip controller 212 controls the operation of memory array 214, which provides data at first data pin 206. Memory array 214 includes an array of memory cells each corresponding to an address. The addresses of all the memory cells define an address range of SROM 200. A switch 216 connects between first data pin 206 and second data pin 210. A latch 218 coupled to address clock pin 202 and CS/CAS pin 208 latches a signal on CS/CAS pin 208 during the address cycle. The output of latch 218 controls the status of switch 216. When the output of latch 218 is a logic "1", switch 216 is closed, a data path between first data pin 206 and second data pin 210, or a cascading data path, is connected. When the output of latch 218 is a logic "0", switch 216 is open, the cascading data path is blocked.

In operation, an address clock signal is first sent to address clock pin 202, starting the address cycle. During the address cycle, a 24-bit address is sent bit-by-bit through first data pin 206 to chip controller 212. If the address received falls within the address range of SROM 200, SROM 200 is activated and the address is stored in SROM 200. Then, a data clock signal is received at data clock pin 204, starting the data cycle. During the data cycle, data are read out from memory array 214, starting from the memory cell corresponding to the stored address. After a memory cell corresponding to the stored address is accessed, the stored address automatically increases by 1 and a next memory cell is accessed. Data are output at first data pin 206.

During the address cycle, a control signal of a first kind, or a cascading signal, appearing at CS/CAS pin 208 is latched by latch 218, which controls the status of switch 216. If the cascading signal is a logic "0", latch 218 outputs a "0" and switch 216 is open. If the cascading signal is a logic "1", latch 218 outputs a "1" and switch 216 is closed. When switch 216 is closed, the cascading data path of SROM 200 is connected, external data may be provided to second data pin 210, and SROM 200 outputs such data at first data pin 206.

During the data cycle, a control signal of a second kind, or a chip select signal, appearing at CS/CAS pin 208 is used by chip controller 212 to determine if SROM 200 is selected. If the chip select signal is a logic "0", SROM 200 is deselected and no data may be read out of memory array 214 during the data cycle. Otherwise, SROM 200 is selected and data may be read out of memory array 214.

The novel SROM structure shown in FIG. 2 may be used to build a memory system whose memory capacity can be expanded without increasing the number of address bits required to address each SROM chip therein. FIG. 3 shows a memory system 300, which uses SROM 200 of FIG. 2 for expanded memory capacity, consistent with an embodiment of the present invention.

As shown in FIG. 3, memory system 300 includes a plurality of SROMs 200, identified as 200-1, 200-2, 200-3, 200-4, 200-5, 200-6, . . . Address clock pin 202 of each SROM 200 is coupled to an address clock bus line 302 for receiving an address clock signal. Data clock pin 204 of each SROM 200 is coupled to a data clock bus line 304 for receiving a data clock signal.

The plurality of SROMs 200 are arranged in a cascaded manner, with one or more SROMs 200 in a first tier, one or more SROMs 200 in a second tier, one or more SROMs 200 in a third tier, etc. First data pin 206 of each SROM 200 in the first tier is coupled to a data bus line 306 for receiving an address during an address cycle and providing data during a data cycle. First data pin 206 of each SROM 200 in one tier other than the first tier is coupled to second data pin 210 of another SROM 200 in a tier immediately preceding the one tier. Thus, for example, first data pin 206 of each SROM 200 in the second tier is coupled to second data pin 210 of an SROM 200 in the first tier; first data pin 206 of each SROM 200 in the third tier is coupled to second data pin 210 of an SROM 200 in the second tier; etc.

Particularly in the exemplary memory system 300 shown in FIG. 3, SROM 200-1 and SROM 200-2 are in the first tier of the arrangement and, therefore, first data pins 206 of SROMs 200-1 and 200-2 are directly coupled to data bus line 306. SROMs 200-3, 200-4, and 200-5 are in the second tier. First data pins 206 of SROMs 200-3 and 200-4 are coupled to second data pin 210 of SROM 200-1. First data pin 206 of SROM 200-5 is coupled to second data pin 210 of SROM 200-2. SROM 200-6 is in the third tier and first data pin 206 thereof is coupled to second data pin 210 of SROM 200-3. Thus, SROM 200-3 is coupled to data bus line 306 through SROM 200-1, and data stored in SROM 200-3 may be accessed through SROM 200-1 if the cascading data path of SROM 200-1 is connected and SROM 200-3 is activated and selected. Similarly, SROM 200-6 is coupled to data bus line 306 through SROMs 200-1 and 200-3, and data stored in SROM 200-6 may be accessed through SROM 200-1 and SROM 200-3 if the cascading data paths of both SROM 200-1 and SROM 200-3 are connected and SROM 200-6 is activated and selected.

As shown in FIG. 3, memory system 300 also includes a controller 308 coupled to provide the cascading signals and chip select signals to each of the SROMs 200, allowing each SROM 200 to be selected or deselected and the cascading data path thereof to be connected or blocked independently of one another. Thus, it is possible through control to allow only one SROM 200 at a time to be accessed even if two or more SROMs 200 have overlapping address ranges and are both activated during the address cycle. As a result, memory system 300 allows for an unlimited expansion of memory capacity by allowing overlapping address ranges between two or more SROMs 200, while at the same time retaining the same number of address bits required to address all the SROMs 200.

In operation, an address clock signal is first sent through address clock bus line 302 to address clock pins 202 of all of SROMs 200, starting an address cycle. During the address cycle, an address having, for example, 24 bits, is sent bit-by-bit through data bus line 306 and first data pin 206 to chip controllers 212 of each SROM 200. If the address received falls within the address range of an SROM 200, that SROM 200 is activated, the address being stored therein. Controller 308 may provide a cascading signal to CS/CAS pin 208 of each SROM 200 during the address cycle, which controls the cascading data path of the respective SROM 200.

Then, a data clock signal is sent through data clock bus line 304 to data clock pins 204 of all of SROMs 200, starting a data cycle. During the data cycle, data are read out from the activated SROM 200. If the activated SROM 200 is in the first tier, data are output directly to data bus line 306. If the activated SROM 200 is not in the first tier, data are output to the data bus line 306 through one or more other SROMs 200, through which the activated SROM 200 is coupled to data bus line 306, provided that the cascading data paths of these other SROMs 200 are connected. During the data cycle, a chip select signal may be provided to CS/CAS pin 208 of each SROM 200 to select/deselect the respective SROM 200.

Because memory system 300 allows for overlapping address ranges between two or more SROMs 200, more than one SROM 200 could be activated during the address cycle and controller 308 must provide proper control signals to the SROMs 200 to ensure that only one of the SROMs 200 at a time is being accessed, as more fully explained below.

For example, in memory system 300, to access SROM 200-1, an initial address that falls within the address range of SROM 200-1 is provided to all of SROMs 200 during the address cycle and SROM 200-1 is activated. A chip select signal having a value of logic "1" is provided to CS/CAS pin 208 of SROM 200-1 during the data cycle such that SROM 200-1 is selected and data may be read out from SROM 200-1. For SROMs 200 in memory system 300 whose address ranges do not overlap with that of SROM 200-1, these SROMs 200 will not be activated during the address cycle and, therefore, it does not matter what control signals are provided to these SROMs 200. However, for SROMs 200 in memory system 300 whose address ranges overlap with that of SROM 200-1, it is necessary to prevent these SROMs 200 from being accessed during the data cycle. The prevention of access may be achieved by either deselecting these SROMs 200 during the data cycle or by blocking the data path between these SROMs 200 and data bus line 306. For example, if both SROM 200-1 and SROM 200-3 have an address range of 1–1000, both SROM 200-1 and SROM 200-3 will be activated if the initial address provided during the address cycle falls between 1 and 1000. Controller 308 may either provide a chip select signal having a logic "0" to SROM 200-3 during the data cycle, which deselects SROM 200-3, or provide a cascading signal having a logic value of "0" to SROM 200-1, which blocks the cascading data path of SROM 200-1, thereby blocking a data path between SROM 200-3 and data bus line 306.

In another example in which SROM 200-4 is to be accessed, an initial address that falls within the address range of SROM 200-4 is provided to all of SROMs 200 during the address cycle and SROM 200-4 is activated. To ensure that a data path exists between SROM 200-4 and data bus line 306, the cascading data path of SROM 200-1 must be connected. Therefore, a cascading signal of logic "1" must be provided to SROM 200-1 during the address cycle. At the same time, if a different one of the SROMs 200 in memory system 300 has an address range that overlaps with that of SROM 200-4, a chip select signal of logic "0" must be provided to the different SROM 200 during the data cycle to deselect the different SROM 200, or the data path between the different SROM 200 and data bus line 306 must be blocked. Thus, assuming the address range of SROM 200-1 overlaps that of SROM 200-4, a chip select signal of logic "0" must be provided to SROM 200-1 during the data cycle. Note, however, that the cascading data path of SROM 200-1 must be connected for accessing data from SROM 200-4. As another example, if the address range of SROM 200-3 overlaps that of SROM 200-4, a chip select signal of logic "0" must be provided to SROM 200-3 during the data cycle. Again this is because the cascading data path of SROM 200-1 must be connected for accessing data from SROM 200-4 and SROM 200-3 is also connected to that cascading data path. If, however, the address range of SROM 200-6 overlaps with that of SROM 200-4, one may choose between deselecting SROM 200-6 by providing a chip select signal of logic "0" thereto during the data cycle or blocking a path between SROM 200-6 and data bus line 306 by providing a cascading signal of logic "0" to SROM 200-3 during the address cycle. Similarly, if SROM 200-2 has an address range that overlaps with that of SROM 200-4, SROM 200-2 may be deselected by providing a chip select signal of logic "0" thereto during the data cycle. If SROM 200-5 has an address range that overlaps with that of SROM 200-4, one may choose between deselecting SROM 200-5 by providing a chip select signal of logic "0" thereto during the data cycle or blocking a path between SROM 200-5 and data bus line 306 by providing a cascading signal of logic "0" to SROM 200-2 during the address cycle.

It is to be understood that the above-described memory system 300 is only exemplary and that implementation of the present invention should not be limited thereto. As many SROMs as may be required by a particular application can be similarly cascaded, providing for an unlimited memory capacity. For example, a memory system consistent with the spirit of the present invention may be implemented to include more or less than 3 tiers and each tier may include any number of SROMs. Only the controller (such as controller 308 in memory system 300) needs to be modified accordingly to provide proper control signals to all the SROMs. A memory system consistent with the spirit of the present invention may also use any scheme for providing the control signals, including the cascading signals and chip select signals, as long as conflicts between two or more SROMs having overlapping address ranges are avoided.

In addition, in the above description, it was assumed that a chip select signal of logic "1" would select the respective SROM, while a chip select signal of logic "0" would deselect the respective SROM; it was also assumed that a cascading signal of logic "1" provided to CS/CAS pin 208 of an SROM 200 would close switch 216 thereof, thus connecting the cascading data path of the SROM 200, and a cascading signal of logic "0" provided to CS/CAS pin 208 of an SROM 200 would open switch 216 thereof, thus blocking the cascading data path of the SROM 200. However, one skilled in the art would appreciate that whether a logic "1" or logic "0" for the chip select signal selects the respective SROM and whether a logic "1" or logic "0" for the cascading signal indicates a status of the cascading data path of an SROM are only relative and may be determined based on the particular applications the SROMs are intended for.

Further, it is to be understood that the term "tier" used herein only indicates the electrical connections between the SROMs and does not indicate any limitations to the physical dispositions of the SROMs on a circuit board.

It will be apparent to those skilled in the art that various modifications and variations can be made in the disclosed process without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A serial read-only memory (SROM) device corresponding to an address range, comprising:
    a memory array;
    an address clock pin for receiving an address clock signal, wherein the address clock signal starts an address cycle;
    a data clock pin for receiving a data clock signal, wherein the data clock signal starts a data cycle;
    a chip select/cascade (CS/CAS) pin for receiving a first control signal during the address cycle and for receiving a second control signal during the data cycle;
    a first data pin for receiving an address during the address cycle and for outputting data during the data cycle; and
    a second data pin for receiving external data, the second data pin being connectable to the first data pin through a cascading data path defined therebetween, wherein the external data received at the second data pin may be transmitted to the first data pin when the cascading data path is connected.

2. The SROM device of claim 1, wherein the memory array includes an array of memory cells each corresponding to an address, the addresses of all the memory cells of the memory array defining the address range of the SROM device.

3. The SROM device of claim 1, further comprising a latch for latching the first control signal during the address cycle.

4. The SROM device of claim 3, further comprising a switch for controlling the cascading data path, wherein the latched first control signal determines a status of the switch.

5. The SROM device of claim 1, wherein the second control signal determines whether the SROM device is selected or deselected.

6. The SROM device of claim 1, wherein the SROM device is activated if the address received at the first data pin during the address cycle is within the address range of the SROM device.

7. The SROM device of claim 6, wherein the second control signal determines whether the SROM device is selected or deselected, and data are read out of the memory array and provided at the first data pin during the data cycle if the SROM device is activated and selected.

8. The SROM device of claim 1, further comprising a controller coupled to the address clock pin, the data clock pin, the CS/CAS pin, and the first data pin, wherein the controller determines whether the SROM device is activated based on the address received at the first data pin during the address cycle, whether the cascading data path is connected based on the first control signal received at the CS/CAS pin during the address cycle, and whether the SROM device is selected based on the second control signal received at the CS/CAS pin during the data cycle.

9. The SROM device of claim 1, wherein the data clock cycle starts after the address cycle.

10. A memory system, comprising:
    an address clock bus line for transmitting an address clock signal, wherein the address clock signal starts an address cycle;
    a data clock bus line for transmitting a data clock signal, wherein the data clock signal starts a data cycle;
    a data bus line for transmitting an address during the address cycle and data during the data cycle;
    a chip controller; and
    a plurality of serial read-only memory (SROM) chips each corresponding to a respective address range and including
        a memory array,
        an address clock pin coupled to the address clock bus line for receiving the address clock signal,
        a data clock pin coupled to the data clock bus line for receiving the data clock signal,
        a chip select/cascade (CS/CAS) pin coupled to the chip controller to receive a cascading signal during the address cycle and to receive a chip select signal during the data cycle,
        a first data pin for receiving the address during the address cycle and for outputting data during the data cycle, and
        a second data pin for receiving external data, the second data pin being connectable to the first data pin through a cascading data path defined therebetween, wherein the external data received at the second data pin may be transmitted to the first data pin when the cascading data path is connected.

11. The memory system of claim 10, wherein the memory array of each SROM chip includes an array of memory cells each corresponding to an address, the addresses of all the memory cells of the memory array defining the address range of the respective SROM chip.

12. The memory system of claim 10, wherein each SROM chip further comprises
    a latch to latch the cascading signal during the address cycle; and
    a switch for controlling the cascading data path, wherein the latched cascading signal determines a status of the switch.

13. The memory system of claim 10, wherein the chip select signal received at the CS/CAS pin of each SROM chip determines whether the respective SROM chip is selected or deselected.

14. The memory system of claim 10, wherein a one of the plurality of SROM chips is activated if the address received at the first data pin thereof during the address cycle is within the address range of the one of the plurality of SROM chips.

15. The memory system of claim 14, wherein the chip select signal received at the CS/CAS pin of each SROM chip determines whether the respective SROM chip is selected or deselected, and data are read out of the memory array of a one of the plurality of SROM chips and provided at the first data pin of the respective SROM chip during the data cycle if the respective SROM chip is activated and selected.

16. The memory system of claim 10, wherein each SROM chip further comprises a controller coupled to the address clock pin thereof, the data clock pin thereof, the CS/CAS pin thereof, and the first data pin thereof, wherein the controller determines whether the respective SROM chip is activated based on the address received at the first data pin thereof during the address cycle, whether the cascading data path thereof is connected based on the cascading signal received at the CS/CAS pin thereof during the address cycle, and whether the respective SROM chip is selected based on the chip select signal received at the CS/CAS pin thereof during the data cycle.

17. The memory system of claim 10, wherein the data clock cycle starts after the address cycle.

18. The memory system of claim 10, wherein the plurality of SROM chips are arranged in one or more tiers and are electrically connected to one another in a cascaded manner, wherein the first data pin of each SROM chip in a first tier is directly connected to the data bus line.

19. The memory system of claim 10, wherein the plurality of SROM chips are arranged in two or more tiers, wherein the first data pin of each SROM chip in a second tier is coupled to the second data pin of one of the plurality of SROM chips in the first tier.

20. The memory system of claim 10, wherein the plurality of SROM chips are arranged in more than two tiers, wherein the first data pin of each SROM chip in a one tier other than the first tier is coupled to the second data pin of one of the plurality of SROM chips in a tier immediately preceding the one tier.

21. The memory system of claim 10, wherein the chip controller is coupled to provide the cascading signals to the plurality of SROM chips during the address cycle and to provide the chip select signals to the plurality of SROM chips during the data cycle.

22. The memory system of claim 21, wherein the chip controller provides the cascading signals and chip select signals to the plurality of SROM chips such that only one of the plurality of SROM chips is accessed during the data cycle.

23. The memory system of claim 22, wherein the chip controller can provide a chip select signal, to one of the plurality of SROM chips, effective to deselect the one of the plurality of SROM chips, if the one of the plurality of SROM chips has an address range overlapping with that of another one of the plurality of SROM chips being accessed during the data cycle.

24. The memory system of claim 22, wherein the chip controller can provide the cascading signals and chip select signals to the plurality of SROM chips such that a data path between one of the plurality of SROM chips and the data bus line is blocked, if the one of the plurality of SROM chips has an address range overlapping with that of another one of the plurality of SROM chips being accessed during the data cycle.

* * * * *